US011596086B2

(12) United States Patent
Artman et al.

(10) Patent No.: US 11,596,086 B2
(45) Date of Patent: Feb. 28, 2023

(54) SYSTEMS AND METHODS FOR COOLING AN ELECTRONIC DEVICE VIA INTERFACE OF A HEAT-TRANSFER CONDUIT OF THE ELECTRONIC DEVICE TO A COLD PLATE ASSEMBLY

(71) Applicant: Lenovo Enterprise Solutions (Singapore) Pte. Ltd., New Tech Park (SG)

(72) Inventors: Paul Artman, Research Triangle Park, NC (US); Andrew Thomas Junkins, Research Triangle Park, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 0 days.

(21) Appl. No.: 16/366,000

(22) Filed: Mar. 27, 2019

(65) Prior Publication Data
US 2020/0315066 A1    Oct. 1, 2020

(51) Int. Cl.
*H05K 7/20* (2006.01)

(52) U.S. Cl.
CPC ..... *H05K 7/20509* (2013.01); *H05K 7/20254* (2013.01); *H05K 7/20636* (2013.01)

(58) Field of Classification Search
CPC .. H05K 7/20; H05K 7/20509; H05K 7/20254; H05K 7/20636
USPC ........................................................ 361/702
See application file for complete search history.

(56) References Cited

U.S. PATENT DOCUMENTS

| | | | | |
|---|---|---|---|---|
| 6,657,121 | B2* | 12/2003 | Garner ............... | H05K 7/20681 174/16.3 |
| 6,836,407 | B2* | 12/2004 | Faneuf ..................... | G06F 1/20 165/80.3 |
| 7,012,807 | B2* | 3/2006 | Chu ......................... | G06F 1/20 165/104.33 |
| 7,428,151 | B2* | 9/2008 | Sonnabend ............... | G06F 1/20 361/698 |
| 7,430,118 | B1 | 9/2008 | Noteboom et al. | |
| 7,830,664 | B2* | 11/2010 | Campbell ................. | G06F 1/20 165/80.4 |
| 8,164,901 | B2* | 4/2012 | Neudorfer ................. | G06F 1/20 165/104.21 |
| 8,493,737 | B2* | 7/2013 | Abe ...................... | H01L 23/427 165/104.33 |

(Continued)

*Primary Examiner* — Anatoly Vortman
(74) *Attorney, Agent, or Firm* — Olive Law Group, PLLC

(57) ABSTRACT

Systems and methods for cooling an electronic device via interface of a heat-transfer conduit of the electronic device to a cold plate assembly are disclosed. According to an aspect, a system includes an electronic device including one or more electronic components. Further, the electronic device includes a heat-transfer conduit including a first end and a second end. The first end of the heat-transfer conduit is positioned to receive heat from the electronic component(s). The heat-transfer conduit is configured to conduct heat from the first end to the second end. Further, the system includes a cold plate assembly including a cold plate and a mechanism configured to permit movement of the cold plate. At the first position, the cold plate may contact the second end for receipt of heat from the heat-transfer conduit at the second end. At the second position, the cold plate is apart from the second end.

19 Claims, 4 Drawing Sheets

(56) References Cited

U.S. PATENT DOCUMENTS

| | | | |
|---|---|---|---|
| 8,693,196 B2 * | 4/2014 | Wu | G06F 1/182 |
| | | | 361/679.47 |
| 8,953,320 B2 | 2/2015 | Campbell et al. | |
| 9,049,803 B2 * | 6/2015 | Nordin | H05K 7/20809 |
| 9,483,091 B2 * | 11/2016 | Watanabe | H05K 7/20727 |
| 2006/0187639 A1 * | 8/2006 | Carswell | H05K 7/2079 |
| | | | 361/699 |
| 2009/0244830 A1 | 10/2009 | Wyatt et al. | |

\* cited by examiner

SYSTEMS AND METHODS FOR COOLING AN ELECTRONIC DEVICE VIA INTERFACE OF A HEAT-TRANSFER CONDUIT OF THE ELECTRONIC DEVICE TO A COLD PLATE ASSEMBLY

TECHNICAL FIELD

The presently disclosed subject matter relates generally to electronic device cooling. Particularly, the presently disclosed subject matter relates to systems and methods for cooling an electronic device via interface of a heat-transfer conduit of the electronic device to a cold plate assembly.

BACKGROUND

There is an increasing demand for processing and storage made available by servers residing in data centers. In a data center, servers are typically stacked together in a rack or a case to consolidate network resources and minimize floor space. Servers include heat generating electronic components or devices (such as integrated circuit devices) housed in a modular chassis or case, which in turn is mounted together with other similar modules, in a rack, blade cabinet, blade server, or other support structure. Also, electronic devices, such as input/output (I/O) cards, may be suitably connected to and remove from interface with a server. In practice, multiple servers (each comprising several modules) are typically located in an enclosed space such as a server room or a data center. During operation, the electronic devices in the individual servers generate heat that should be removed for effective functioning of the server.

In order to cool servers, fans are typically used to circulate ambient air from the server room to remove heat from the servers. In addition, fluid may be circulated within a server to transfer heat away from heat-generating electronic components residing within the server. It can be difficult to cool a heat-generating electronic component in instances of a modular server architecture where the heat-generating electronic component resides in a module that is separate from the computer module or motherboard. Cooling heat-generating electronic components, such as high-speed input/output (I/O) cards, via a fluid cooling technique, such as a water loop, is important for certain applications where heat recover and energy efficiency is a key attribute. Current techniques for such cooling are dependent on the I/O slots being integrated within the computer module, thereby making it simpler to include I/O card cooling in the solution. Another solution is complete immersion of all electronics in a die-electric thermal fluid. However, this can be a very expensive solution and generally requires purpose-build hardware.

In view of the foregoing, there is a need for convenient and improved systems and techniques for cooling heat-generating electronic components that are physically removable in a modular server architecture.

BRIEF DESCRIPTION OF THE DRAWINGS

Figure 1:
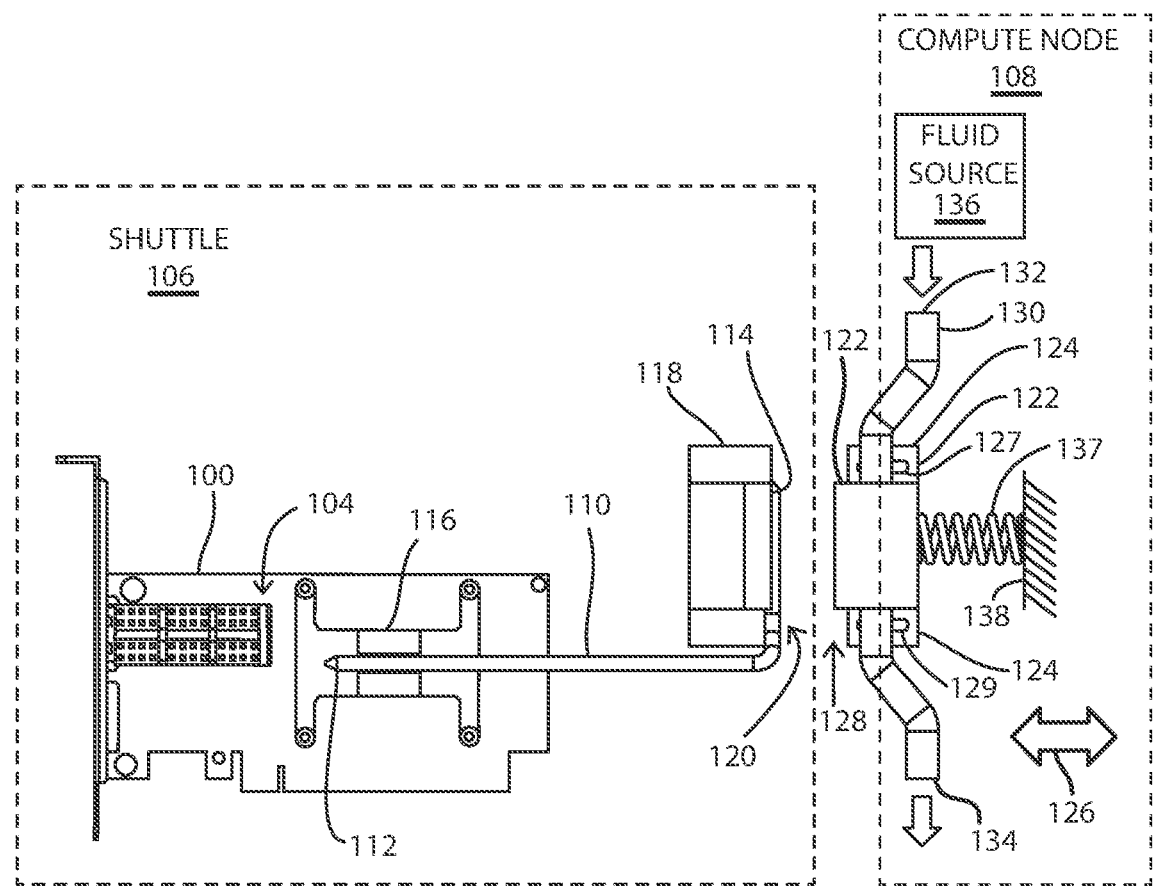
Figure 2:
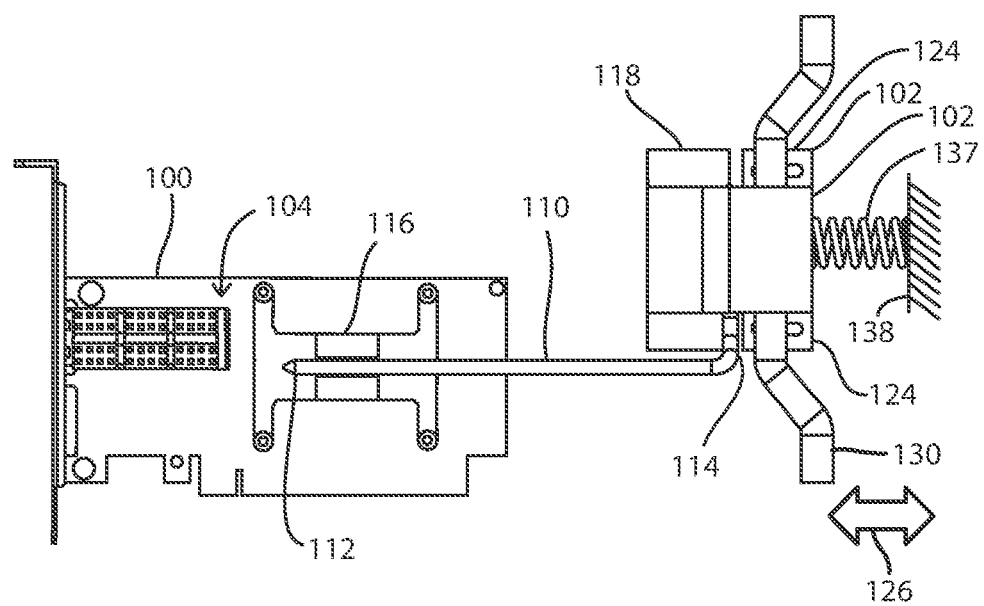
Figure 3:
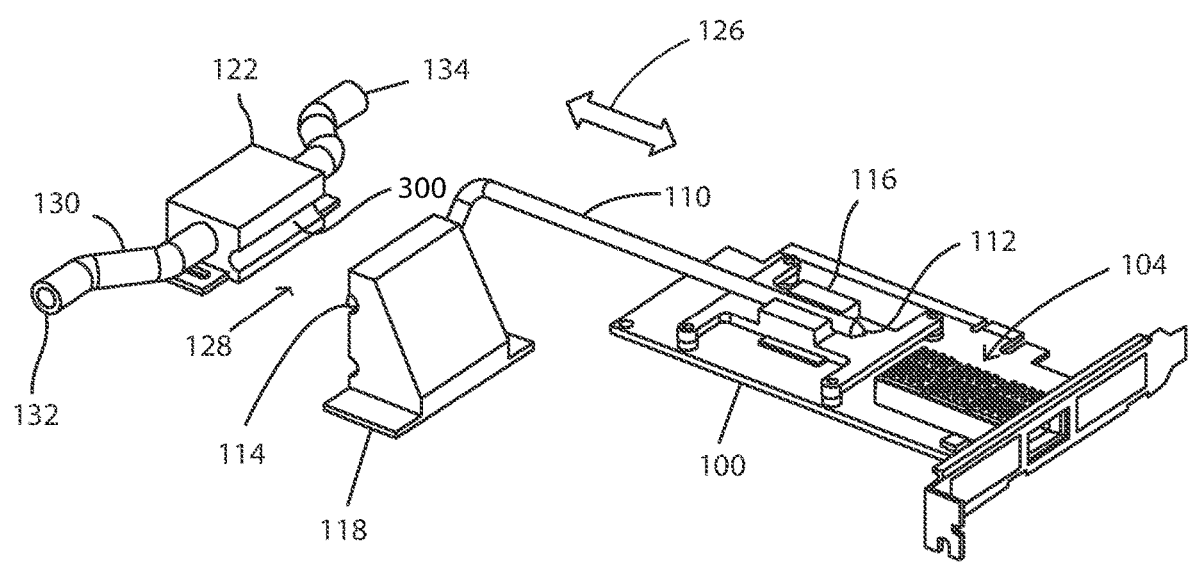
Figure 4:
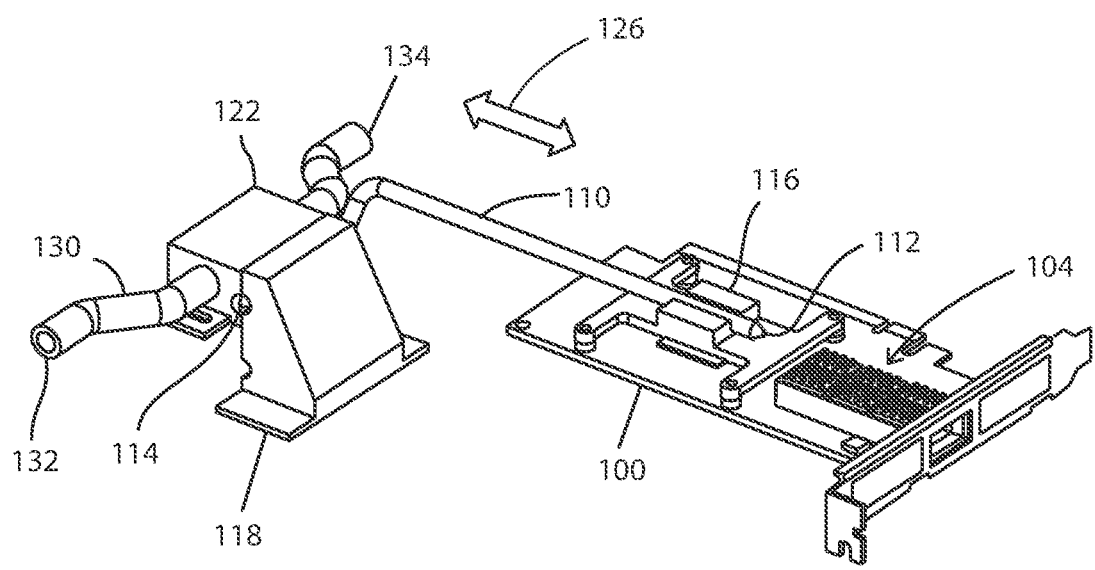

Having thus described the presently disclosed subject matter in general terms, reference will now be made to the accompanying Drawings, which are not necessarily drawn to scale, and wherein:

FIG. 1 is a diagrammatic top view of an example system including an electronic device and a cold plate assembly for transferring heat from electronic components of the electronic device in accordance with embodiments of the present disclosure;

FIG. 2 is a diagrammatic top view of the example system of FIG. 1 where the shuttle physically connected to the compute node for operable interface of the electronic device with the server;

FIG. 3 is a perspective view of the example electronic device and cold plate assembly shown in FIGS. 1 and 2 in the position in which the cold plate is apart from the end of the heat-transfer conduit; and FIG. 4 illustrates a perspective view of the example electronic device and cold plate assembly shown in FIGS. 1-3 in the position in which the cold plate thermally couples to the end of the heat-transfer conduit.

SUMMARY

Disclosed herein are systems and methods for cooling an electronic device via interface of a heat-transfer conduit of the electronic device to a cold plate assembly. According to an aspect, a system includes an electronic device including one or more electronic components. Further, the electronic device includes a heat-transfer conduit including a first end and a second end. The first end of the heat-transfer conduit is positioned to receive heat from the electronic component(s). The heat-transfer conduit is configured to conduct heat from the first end to the second end. Further, the system includes a cold plate assembly including a cold plate and a mechanism configured to permit movement of the cold plate between a first position and a second position. At the first position, the cold plate may contact the second end for receipt of heat from the heat-transfer conduit at the second end. At the second position, the cold plate is apart from the second end.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

As referred to herein, the terms "electronics rack" and "rack" are used interchangeably, and unless otherwise specified include any housing, frame, rack, compartment, server system, or the like having one or more heat-generating electronic components of a computing device, electronic system, or information technology equipment. For example, the electronics rack may carry one or more servers residing in a data center or server farm. The heat-generating electronic device may have one or more electronic components that require cooling for the system to function properly. In an example, an electronics rack may be part of an electronic system, a single electronic system, or multiple electronic systems, for example, in one or more sub-housings, blades, books, drawers, nodes, compartments, or the like having one or more heat-generating electronic components disposed therein. An electronic device within an electronics rack may be movable or fixed, relative to the electronics rack, with rack-mounted electronic drawers and blades of a blade center system being two examples of electronic systems (or subsystems) of an electronics rack to be cooled. Further, for example, the heat-generating electronic component may be a removable component of the electronic device such as, but not limited to, an I/O card, a solid state drive (SSD), an expansion card, a redundant array of independent disks (RAID) adapter, or the like.

As referred to herein, the terms "electronic component" or "component" may be any component capable of generating heat. For example, an electronic component may require cooling in order that it, its associated computing device, a nearby computing device, or another component can function properly. By way of example, an electronic component may comprise one or more integrated circuit dies and/or other electronic devices to be cooled, including one or more processor dies, memory dies or memory support dies. As a further example, the electronic component may be one or more bare dies or one or more packaged dies disposed on a common carrier. Also, as mentioned, an electronic component may be an I/O card, a SSD, an expansion card, or the like.

As referred to herein, the term "cold plate" is any structure or system having features to assist in transferring heat from one heat source to another area. For example, a cold plate may have fins, pins, or other such features to assist in transferring heat from another object to coolant. The cold plate may be made entirely or at least partially of a thermally conductive material, such as metal. In an example, the cold plate may have one or more channels or passageways formed therein for flowing of liquid-coolant therethrough.

In accordance with embodiments of the present disclosure, systems and methods are provided for cooling heat-generating electronic components within a modular server architecture. It should be recognized that the systems and techniques disclosed herein may also be suitably applied to any computing system in which cooling of a heating-generating electronic component is desired that resides in a removable electronic device. A system in accordance with embodiments of the present disclosure may include an electronic device having one or more electronic components that are to be cooled. The electronic device may be removable from a modular computing architecture, such as a modular server architecture. The electronic device may include a heat-transfer conduit including two different ends. One end of the heat-transfer conduit may be thermally coupled to the electronic component(s). Further, the heat-transfer conduit may be configured to conduct heat from the end where it is coupled to the electronic component(s) to the other end where it can interface with a cold plate assembly to thereby transfer heat generated by the electronic component(s) to the cold plate assembly. In an example, the heat-transfer conduit may be a heat pipe that can contact the cold plate assembly for transferring the heat away from the electronic device(s).

A cold plate assembly in accordance with embodiments of the present disclosure may be part of a computing device, such as a server including a motherboard. The computing device may include a fluid conduit integrated with a cold plate of the cold plate assembly. Further, the fluid conduit may be suitably configured to allow fluid to pass therein for transferring heat from the cold plate. The cold plate assembly may include a mechanism suitably configured to permit movement of the cold plate between a first position and a second position as described in further detail herein by example. At the first position, the cold plate may thermally couple to the end of the heat-transfer conduit for receipt of heat from the heat-transfer conduit. At the second position, the cold plate may be separate from that end of the heat-transfer conduit.

FIG. 1 illustrates a diagrammatic top view of an example system including an electronic device 100 and a cold plate assembly 102 for transferring heat from electronic components 104 of the electronic device 100 in accordance with embodiments of the present disclosure. In this example, the electronic device 100 is part of a server shuttle 106 configured to physically connect to and operably interface with a compute node 108 of a server. FIG. 1 the figure shows a state in which the server shuttle 106 is disconnected and apart from the compute node 108. Described in further detail hereinafter, FIG. 2 illustrates a diagrammatic top view of the example system of FIG. 1 where the shuttle 106 physically connected to the compute node 108 for operable interface of the electronic device 100 with the server as will be understood to those of skill in the art. In this example, the electronic device 100 is an I/O card, but it may be any other suitable removable electronic component.

Referring to FIG. 1, the electronic device 100 includes a heat-transfer conduit 110 having ends 112 and 114. In this example, the heat-transfer conduit 110 is a heat pipe, but may alternatively be any other type of component for transferring heat from one location to another location. The end 112 of the heat-transfer conduit 110 may be positioned and configured to thermally couple to the electronic components 104 such that at least some of the heat produced by the electronic components is received at the end 112. In this example, the electronic device 100 includes a heat sink 116 thermally coupled to the end 112. The heat sink 116 may be positioned for receipt of heat from the electronic components 104 and for transfer of the received heat to the end 112. The heat sink 116 may be suitably mounted to a board of the electronic device 100.

The heat received at the end 112 of the heat-transfer conduit 110 directly from the electronic components 104 and/or the heat sink 116 may subsequently transfer through the conduit 110 and to the end 114. The electronic device 100 may include a bracket 118 that holds the end 114 to secure it to the electronic device 100. A portion (generally indicated by reference numeral 120) is exposed outside of the bracket 118 such that this portion 120 may be available for interface with the cold plate assembly 102.

The cold plate assembly 102 includes a cold plate 122 that is secured to an end of the computing node 108 by a bracket 124. An upper portion of the bracket 124 is attached to the cold plate 122 and configured to translate in directions indicated by double-sided arrow 126. In an example, a pair of pins (not shown) may hold the upper portion of the bracket 124 to a lower portion of the bracket 124 and may each be positioned within respective openings 127 and 129 to slide the upper portion of the bracket 124 in the directions indicated by arrow 126. The cold plate 122, due to its attachment to the upper portion of the bracket 124, may also translate in the directions indicated by arrow 126.

As shown in FIG. 1, the end 114 of the heat-transfer conduit 110 and the cold plate 122 are apart from one another and separated by a space indicated generally by reference numeral 128. The electronic device 100 may be moved towards the cold plate assembly 102 such that the exposed portion of the end 114 comes into contact with the cold plate 122 as shown in FIG. 2. Now turning to FIG. 2, in this position heat that has been transferred to the end 114 can be transferred to the cold plate 122. As a result, heat generated by the electronic components 104 can be transferred by the heat sink 116 to the heat-transfer conduit 110, and then from the heat-transfer conduit 110 to the cold plate.

A fluid conduit 130 may be integrated with the cold plate 122 and configured to allow fluid to pass therein for transferring heat from the cold plate 122. The fluid conduit 130 may include a fluid inlet 132 for receipt of fluid and a fluid outlet 134 for exit of fluid. The fluid inlet 132 may be operatively connected to a fluid source 136 for receipt of fluid for cooling of the cold plate 122. The cold plate 122 may heat the fluid in the fluid conduit 130. The fluid in the fluid conduit 130 may exit downstream at the fluid outlet 134. The fluid may be circulated through the conduit 130 and cooled for cooling of the cold plate 122 as will be understood by those of skill in the art. Example fluid includes, but is not limited to, water, brine, dielectric liquid, fluorocarbon liquid, liquid metal, a refrigerant, or the like. The fluid conduit 130 may be entirely or at least partially made of a flexible material, such as rubber.

In the position shown in FIG. 2, the electronic device 100 is operatively engaged with the compute node 108. Further, a coiled spring 137 may be compressed against an anchor 138 or other rigid object such that the coiled spring 137 exerts a force against the cold plate assembly 102. As a result, the cold plate 122 is kept pressed against the exposed portion of the end 114. In the alternative, the coiled spring 137 may be any suitable resilient member configured to bias the cold plate 122 in the direction of the end 114 when in this position. The fluid conduit 130 is flexible such that it can move along with the cold plate 122 between the position shown in FIG. 1 and the position shown in FIG. 2.

FIG. 3 illustrates a perspective view of the example electronic device 100 and cold plate assembly 102 shown in FIGS. 1 and 2 in the position in which the cold plate 122 is apart from the end 114 of the heat-transfer conduit 110. It is noted that in this view, the cold plate 122 defines a channel 300 on one side such that the exposed portion of the end 114 can fit therein.

FIG. 4 illustrates a perspective view of the example electronic device 100 and cold plate assembly 102 shown in FIGS. 1 and 2 in the position in which the cold plate 122 thermally couples to the end 114 of the heat-transfer conduit 110.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A system comprising:
  an electronic device including at least one electronic component and a heat-transfer conduit comprising a heat pipe including a first closed end and a second closed end, the first closed end being positioned to receive heat from the at least one electronic component, wherein the electronic device is a removable expansion card within a compute node, wherein the heat-transfer conduit is configured to conduct heat from the first closed end to the second closed end, and wherein the second closed end of the heat pipe comprises an exposed, convex outside surface;
  a cold plate assembly including a cold plate and a mechanism configured to permit movement of the cold plate between a first position and a second position, wherein the cold plate assembly defines a concave surface contoured to fit to and receive the exposed, convex outside surface of the second closed end of the heat pipe, wherein at the first position the defined concave surface of the cold plate contacts the exposed, convex surface of the heat pipe for receipt of heat by the cold plate from the heat pipe, and wherein at the second position the cold plate is apart from the exposed, convex surface of the heat pipe;
  a fluid conduit within the compute node, the fluid conduit being integrated with the cold plate and configured to allow fluid to pass therein for transferring heat from the cold plate; and
  a bracket that secures the second closed end to the electronic device such that a portion of the second closed end is exposed outside of the bracket for contact with the cold plate, wherein the portion of the second closed end extends in a direction towards the cold plate farther than the bracket.

2. The system of claim 1, wherein the electronic device is one of an input/output (I/O) card, a solid state drive (SSD), and a redundant array of independent disks (RAID) adapter.

3. The system of claim 1, wherein the cold plate assembly comprises a resilient member configured to bias the cold plate in the direction of the first position.

4. The system of claim 3, wherein the resilient member is a coiled spring.

5. The system of claim 1, wherein the electronic device further comprises a heat sink configured to receive heat from the at least one electronic component, wherein the first closed end is configured to receive heat from the heat sink.

6. The system of claim 5, wherein the first closed end is attached to the heat sink.

7. The system of claim 1, further comprising a bracket that attaches the electronic device to a server shuttle.

8. The system of claim 1, wherein the fluid conduit includes a fluid inlet for receipt of fluid and a fluid outlet for exit of fluid, wherein the fluid inlet is connected to a fluid source for receipt of cooled fluid.

9. The system of claim 1, wherein the fluid conduit passes through the cold plate.

10. The system of claim 1, wherein the fluid conduit is made of flexible material, wherein the fluid conduit is flexible such that it moves along with the cold plate between the first position and the second position.

11. The system of claim 1, wherein the defined concave surface of the cold plate comprises a channel defined on a side of the cold plate for fit to the exposed, convex surface of the heat pipe when at the first position.

12. The system of claim 1, wherein the cold plate assembly defines a channel for receiving the exposed, convex surface of the second closed end of the heat pipe.

13. A method comprising:
  providing an electronic device including at least one electronic component and a heat-transfer conduit comprising a heat pipe including a first closed end and a second closed end, the first closed end being positioned to receive heat from the at least one electronic component, wherein the electronic device is a removable expansion card within a compute node, wherein the heat-transfer conduit is configured to conduct heat from the first closed end to the second closed end, and wherein the second closed end of the heat pipe comprises an exposed, convex outside surface;
  providing a cold plate assembly including a cold plate and a mechanism configured to permit movement of the cold plate between a first position and a second position, and wherein the cold plate assembly defines a concave surface contoured to fit to and receive the exposed, convex surface of the second closed end of the heat pipe;
  moving the electronic device from the second position where the cold plate is separate from the exposed, convex surface of the second closed end of the heat pipe to the first position where the defined concave surface of the cold plate contacts the exposed, convex surface of the second closed end of the heat pipe for receipt of heat by the cold plate from the heat pipe;

providing a fluid conduit within the compute node, the fluid conduit being integrated with the cold plate and configured to allow fluid to pass therein for transferring heat from the cold plate; and providing a bracket that secures the second closed end to the electronic device such that a portion of the second closed end is exposed outside of the bracket for contact with the cold plate, wherein the portion of the second closed end extends in a direction towards the cold plate farther than the bracket.

14. The method of claim 13, wherein the cold plate assembly comprises a resilient member configured to bias the cold plate in the direction of the first position.

15. The method of claim 13, wherein the electronic device further comprises a heat sink configured to receive heat from the at least one electronic component, wherein the first closed end is configured to receive heat from the heat sink.

16. The method of claim 13, wherein the fluid conduit includes a fluid inlet for receipt of fluid and a fluid outlet for exit of fluid, wherein the fluid inlet is connected to a fluid source for receipt of cooled fluid.

17. The method of claim 13, wherein the fluid conduit is made of flexible material.

18. The method of claim 13, wherein the defined concave surface of the cold plate comprises a channel defined on a side of the cold plate for fit to the exposed, convex surface of the heat pipe when at the first position.

19. The method of claim 13, wherein the cold plate assembly defines a channel for receiving the exposed, convex surface of the second closed end of the heat pipe.

* * * * *